United States Patent
Huber et al.

(10) Patent No.: US 6,714,147 B2
(45) Date of Patent: Mar. 30, 2004

(54) METHOD FOR COMPRESSING DATA

(75) Inventors: Klaus Huber, Darmstadt (DE); Peter Windirsch, Dreieich (DE); Tim Schneider, Darmstadt (DE); Ralf Schaffelhofer, Darmstadt (DE); Matthias Baumgart, Giessen (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 10/223,819

(22) Filed: Aug. 20, 2002

(65) Prior Publication Data

US 2003/0038739 A1 Feb. 27, 2003

(30) Foreign Application Priority Data

Aug. 21, 2001 (DE) .......................................... 101 40 993

(51) Int. Cl.[7] .............................................. H03M 7/00
(52) U.S. Cl. ........................................... 341/51; 341/50
(58) Field of Search .............................. 341/51, 50, 87; 768/203, 212

(56) References Cited

U.S. PATENT DOCUMENTS

| | | | |
|---|---|---|---|
| 4,412,301 A | * | 10/1983 | Strubeck ..................... 708/212 |
| 5,034,965 A | * | 7/1991 | Kato ........................... 375/243 |
| 5,231,604 A | * | 7/1993 | Watanabe .............. 365/189.05 |
| 5,617,333 A | * | 4/1997 | Oyamada et al. ........... 709/247 |
| 5,627,533 A | * | 5/1997 | Clark .......................... 341/51 |

OTHER PUBLICATIONS

Ziv et al. "A Universal Algorithm for Sequential Data Compression" in Transactions on Information Theory, May 1977, pp. 337–343.

Cover "Enumerative Source Encoding" in Transactions on Information Theory, Jan. 1973, pp. 73–77.

* cited by examiner

Primary Examiner—Peguy JeanPierre
(74) Attorney, Agent, or Firm—Davidson, Davidson & Kappel, LLC

(57) ABSTRACT

In a method for compressing data, in which, in a data stream composed of characters, character strings are checked for correlation with other character strings that are present at a given distance in the data stream, and in which, in each case, the number of correlating characters and the position of the correlating characters within the respective other character string constitute the compressed data, at least one character is allowed to differ in the correlation check and data for correcting the at least one differing character is inserted into the compressed data.

13 Claims, 3 Drawing Sheets

METHOD FOR COMPRESSING DATA

CROSS-REFERENCE TO RELATED APPLICATIONS

This invention claims priority to German Patent Application No. DE 101 40 993.1, which is hereby incorporated by reference herein.

BACKGROUND

The present invention relates to a method for compressing data, in which, in a data stream composed of characters, character strings are checked for correlation with other character strings that are present at a given distance in the data stream, and in which, in each case, the number of correlating characters and the position of the correlating characters within the respective other character string constitute the compressed data.

To be able to transmit or store data efficiently, use is made of methods for compressing the data. In connection with these methods, a distinction is made between lossless and lossy compression methods. The lossless methods have the feature that the original data can be completely constructed from the compressed data. In the case of lossy methods, however, complete reconstruction of the original data is not guaranteed.

Compression methods having the objective of reducing the respective data volume are used in many ways in information and communication technology, for example, in digital television or in electronic communication.

Compression methods are also used in connection with data encryption, the source text being compressed prior to encryption, thus making cryptoanalysis more difficult due to low redundancy Methods for compressing data, in which, in a data stream composed of characters, character strings are checked for correlation with other character strings that are present at a given distance in the data stream, and in which, in each case, the number of correlating characters and the position of the correlating characters within the respective other character string constitute the compressed data, are referred to as Lempel-Ziv methods. One of these methods is described in Ziv J., Lempel A. "A Universal Algorithm for Sequential Data Compression", IEEE Transactions on Information Theory, Vol. 23, No.3, May 1977, pp. 337–343, which is hereby incorporated by reference herein.

SUMMARY OF THE INVENTION

An object of the present invention is to provide a method for compressing data which has a relatively high compression rate.

The present invention provides a method for compressing data, in which, in a data stream composed of characters, character strings are checked for correlation with other character strings that are present at a given distance in the data stream, and in which, in each case, the number of correlating characters and the position of the correlating characters within the respective other character string constitute the compressed data, wherein at least one character is allowed to differ in the correlation check; and in addition, data for correcting the at least one differing character is inserted into the compressed data. Preferably, an item of information on the position of the at least one differing character is inserted.

By allowing "errors" in the correlation check, the number of correlating characters is on average higher than in the case of an exact check and thus, on average, longer strings of characters can be coded using the information on the number and position. The number of permitted differing characters can be selected depending on the property of the data to be compressed.

The characters forming the data stream can be of different types in the method according to the present invention. Thus, for example, characters, which can assume many values, or binary characters are possible.

In certain embodiments of the present invention, when working with characters which can assume more than two values, the true value of the at least one differing character is inserted or, a procedure for determining the true value from the value of the differing character is inserted.

For example, when compressing text data, this procedure can consist in regarding a word or a part of a word as correlating with a word or a part of a word, which, as such, is identical but in which an upper case letter occurs in place of a lower case letter, for example, at the beginning of a sentence. Then, instead of the true value, for example, an upper case D, it is only required to insert into the compressed data a procedure for changing the lower case d during decompression; in the example: replace the lower case letter with the corresponding upper case letter.

In another embodiment of the present invention, when working with binary characters, the differing characters are marked by inserting only their position.

In order for the compression gain achieved by the method according to the present invention to be diminished as little as possible by the additional information, in an embodiment of the method a compressing code is used for coding the positions of the differing characters. Preferably, binary vectors having the length n and the weight e are used for coding e positions of differing characters over a length of n, all binary vectors of a particular weight being numbered.

In order to prevent randomly occurring errors during transmission or storage in the data compressed using the method according to the present invention, the compressed data is coded in an error-correcting manner, adding redundancy. In this context, the error-correcting code may be a block code or a convolutional code. In this connection, suitable block codes include Reed-Solomon codes and Hamming codes.

According to the present invention, the length of the compressed data is preferably a multiple of 8 bits. This allows simple adaptation to other data processing methods and to suitable devices.

The method according to the present invention can be performed using programmable devices (microprocessors, microcontrollers) and suitable programs as well as with hardware adapted to the method according to the present invention.

BRIEF DESCRIPTION OF THE DRAWINGS

The present invention will be explained in greater detail in the following description based on exemplary embodiments with reference to the drawings.

DETAILED DESCRIPTION

Figure 1:
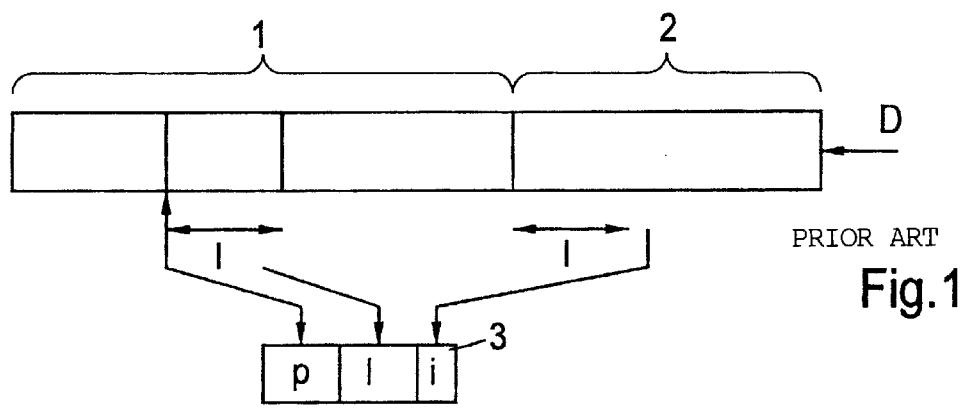
FIG. 1 shows a schematic representation of a prior art Lempel-Ziv method.

Referring to FIG. 1, both in the Lempel-Ziv method and in the method according to the present invention, the data to be compressed is written into a shift register composed of two parts 1, 2 in the direction of the arrow, to be more precise, first into Part 2. Part 1 is occupied by a suitable initial value. For these purposes, for example, it can be assumed the initial values of all characters located in Part 1 are equal to 0. In the Lempel-Ziv method, it is then checked whether the character string which starts at the beginning of Part 2 is already present in Part 1. If this is the case, then the position p within Part 1 at which this characters string begins is coded. Inserted into compressed data 3 are, moreover, the number 1 of correlating characters or the length of the correlated sequence. Finally, the first character of the sequence which starts at the beginning of Part 2 that is not present in Part 1 is added as a so-called "innovative symbol" i. Innovative symbol i guarantees the functionality of the method for the case that the sequence which begins in Part 2 does not occur in Part 1. Position p, length l and innovative symbol i form a code word 3 (compressed data) and can be stored or transmitted.

Figure 2:
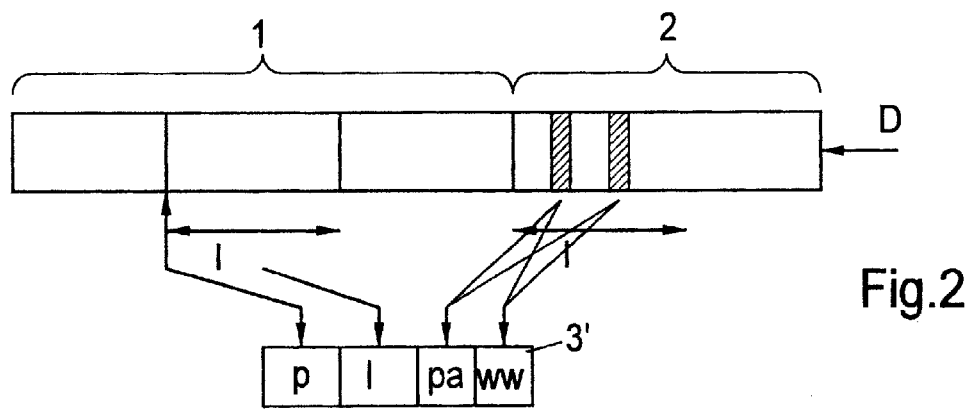
FIG. 2 shows a schematic representation of an embodiment of the method for compressing data according to the present invention.

In the method according to the present invention, the data to be compressed is also written into a shift register composed of two parts 1, 2. In the subsequent check, however, two differing characters are permitted, which are shown hatched in FIG. 2. The number of characters that are thus regarded as correlating is larger than in the example of the known method in FIG. 1. Again, code word 3' to be stored or transmitted contains the position p and the number 1 of characters that are regarded as correlating. In addition, the positions pa of the differing characters and the true values ww of the differing characters are provided in the code word.

Figure 6:
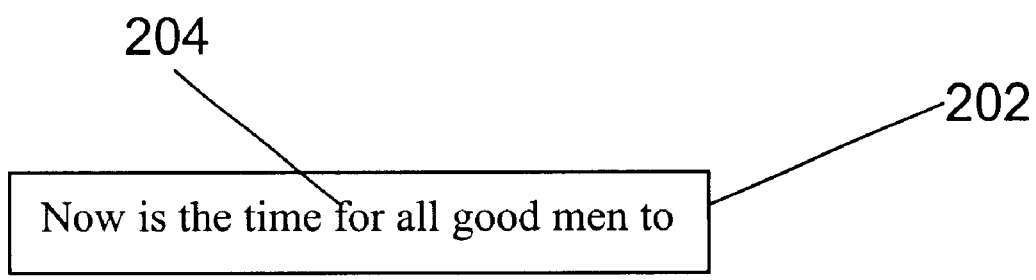
FIG. 6 shows a data stream composed of text data.

The data to be compressed may be composed of binary characters which can assume only two values. In other embodiments, the data to be compressed may be text data including characters of the alphabet, which can assume more than two values. FIG. 6 shows an exemplary data stream 202 of characters 204. A given character 204 may be any character of the alphabet.

Figure 3:
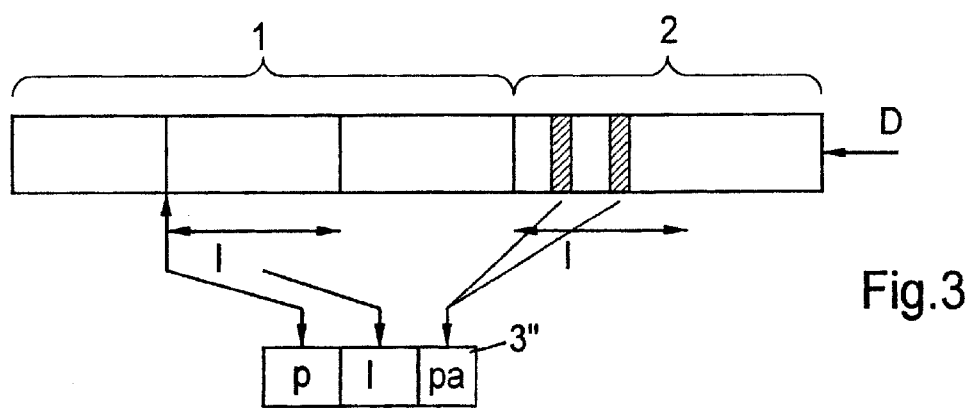
FIG. 3 shows a schematic representation of another embodiment of the method for compressing data according to the present invention.
Figure 4:
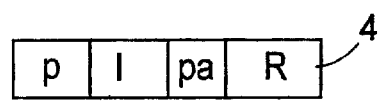
FIG. 4 shows a schematic representation of an embodiment of a subsequent error-correcting coding.

In the exemplary embodiment according to FIG. 3, the characters are assumed to be binary so that only the error positions are contained in code word 3'' to be stored or transmitted, which will allow the true values to be recovered by inverting the characters at these positions.

When coding e positions of differing characters, which will hereinafter also be referred to as errors, over a length of n, it is best to use binary vectors having the length n and the weight e. During coding, it is possible to use efficient methods to number all binary vectors of a particular weight. See, for example, Cover, T., "Enumerative Source Coding", IEEE Transactions on Information Theory, Vol.19, No. 1, January 1973, pp. 73–77, which is hereby incorporated by reference herein. In this manner, the positions are optimally coded, i.e., with a minimum number of bits.

In this context, the coding of the error positions is carried out using $\log_2(_e^n)$ bits, it being required to round up to the next whole number. For example, in the case that e=2, there are $(_2^n)=n\cdot(n-1)/(1\cdot 2)=n\cdot(n-1)/2$ possibilities of how the characters can be arranged. In the case of two errors, therefore, one does not need $2\log_2 n$ bits but one bit less to characterize the errors. This bit can be used, for example, for error correction, depending on the boundary conditions. In the general case of correcting e errors, $\log_2(_e^n)$ bits are required for coding all error patterns, it being required to round up to the next whole number. This is an optimum coding of the error patterns, that is, the coding cannot be carried out with less bits. For the conversion of the error patterns in common representations, there are efficient algorithms, as described, for example, in T. Cover, "Enumerative Source Coding", supra.

If the discussed alphabet is binary, i.e., identical to {0,1}, then the specification of the error values, which then, of course, are equal to one, can be dispensed with. The binary case is shown in FIG. 3. In the binary case, different cases can be looked at. First of all, the discussed alphabet of the data stream can be binary. Secondly, for reasons of efficiency, it is also possible to look at a non-binary data stream and to binarily code only the error positions in the code word to be stored.

Figure 5:
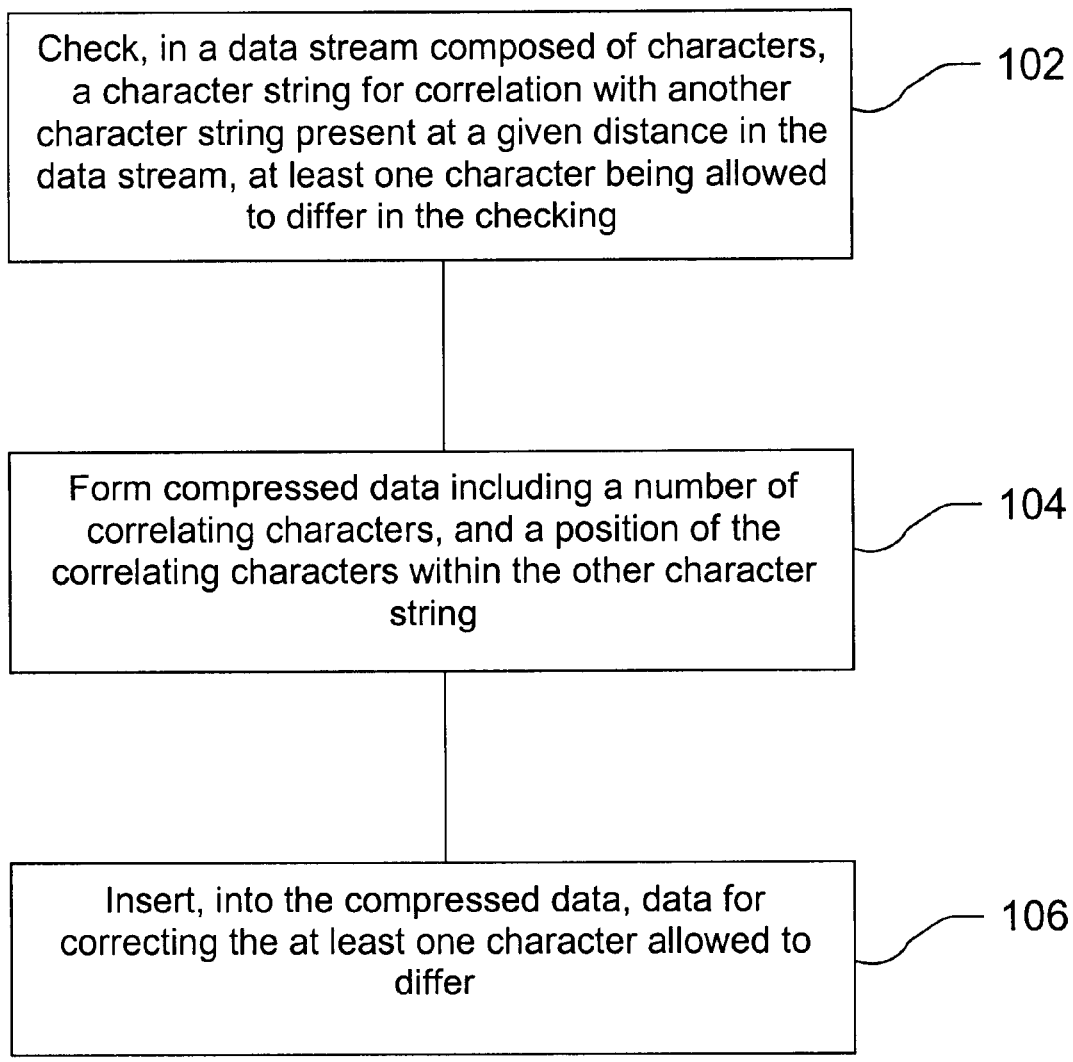
FIG. 5 shows a flow chart of a method for compressing data according to the present invention

Reference is now made to FIG. 5, which shows a flow chart of a method for data compression according to the present invention. In a data stream composed of characters, a character string is checked for correlation with another character string present at a given distance in the data stream, at least one character being allowed to differ in the checking (see block 102). Compressed data is formed, the compressed data including a number of correlating characters and a position of the correlating characters within the other character string (see block 104). Data for correcting the at least one character allowed to differ is inserted into the compressed data (see block 106).

What is claimed is:

1. A method for compressing data, comprising:
   checking, in a data stream composed of characters, a character string for correlation with another character string present at a given distance in the data stream, at least one character being allowed to differ in the checking;
   forming compressed data including a number of correlating characters, and a position of the correlating characters within the other character string; and
   inserting, into the compressed data, data for correcting the at least one character allowed to differ.

2. The method as recited in claim 1 wherein the data for correcting the at least one character allowed to differ includes information on a position of the at least one character allowed to differ.

3. The method as recited in claim 2 wherein the characters can assume more than two values and wherein the data for correcting the at least one character allowed to differ include a true value of the at least one character allowed to differ.

4. The method as recited in claim 2 wherein the characters can assume more than two values and wherein the data for correcting the at least one character allowed to differ include a procedure for determining a true value of the at least one character allowed to differ from a value of the at least one character allowed to differ.

5. The method as recited in claim 2 wherein the characters are binary characters and wherein the data for correcting the at least one character allowed to differ is a position of the at least one character allowed to differ.

6. The method as recited in claim 1 wherein the inserting includes coding, using a compressing code, a position of the at least one character allowed to differ.

7. The method as recited in claim 6 wherein the coding includes using respective binary vectors for coding a number of positions of the at least one character allowed to differ over a length of character string, each binary vector having a length equal to the length of character string and a weight equal to the number of positions, binary vectors of a particular weight being numbered.

8. The method as recited in claim 1 further comprising coding the compressed data in an error-correcting manner so as to add redundancy.

9. The method as recited in claim 8 wherein the coding is performed using a block code.

10. The method as recited in claim 8 wherein the coding is performed using a convolutional code.

11. The method as recited in claim 9 wherein the block code includes a Reed-Solomon code.

12. The method as recited in claim 9 wherein the block code includes a Hamming code.

13. The method as recited in claim 1 wherein a length of the compressed data is a multiple of 8 bits.

* * * * *